United States Patent [19]

Nakamura et al.

[11] Patent Number: 4,552,835
[45] Date of Patent: Nov. 12, 1985

[54] SILVER HALIDE PHOTOGRAPHIC LIGHT-SENSITIVE ELEMENT HAVING A LIGHT INSENSITIVE UPPER LAYER

[75] Inventors: Taku Nakamura; Yasuo Kasama, both of Kanagawa, Japan

[73] Assignee: Fuji Photo Film Co., Ltd., Kanagawa, Japan

[21] Appl. No.: 620,773

[22] Filed: Jun. 14, 1984

[30] Foreign Application Priority Data

Jun. 17, 1983 [JP] Japan .................... 58-108688

[51] Int. Cl.$^4$ .............................................. G03C 1/94
[52] U.S. Cl. ................................... 430/523; 430/950; 430/961
[58] Field of Search ............... 430/523, 950, 961, 553

[56] References Cited

U.S. PATENT DOCUMENTS

| | | | |
|---|---|---|---|
| 3,898,088 | 8/1975 | Cohen et al. | 430/523 |
| 4,047,957 | 9/1977 | DeWinter et al. | 430/961 |
| 4,301,240 | 11/1981 | Bruck et al. | 430/950 |
| 4,330,618 | 5/1982 | Minamizono et al. | 430/523 |
| 4,343,894 | 8/1982 | Minamizono et al. | 430/961 |
| 4,362,812 | 12/1982 | Minamizono et al. | 430/961 |
| 4,363,871 | 12/1982 | Shibue et al. | 430/523 |
| 4,374,924 | 2/1983 | Yokoyama et al. | 430/523 |
| 4,460,680 | 7/1984 | Ogawa et al. | 430/961 |
| 4,464,462 | 8/1984 | Sugimoto et al. | 430/961 |

*Primary Examiner*—Jack P. Brammer
*Attorney, Agent, or Firm*—Sughrue, Mion, Zinn, Macpeak, and Seas

[57] ABSTRACT

A silver halide photographic light-sensitive material for photomechanical process and a method for the reduction treatment of said light-sensitive material are described. The light-sensitive material comprises a support, at least one light-sensitive silver halide emulsion layer, and at least one light-insensitive upper layer, characterized in that at least one light-insensitive upper layer contains a polymer comprising: (a) a monomer unit containing at least one group having an electric charge; and (b) a monomer unit having a functional group capable of crosslinking through a gelatin hardening agent with a like functional group of another polymer chain of the same type or with gelatin. The light-sensitive material is very advantageous; for example, it has greatly improved reduction treatment suitability, and the reduction treatment suitability is not deteriorated even if the amount of silver coated per unit area is reduced.

14 Claims, No Drawings

SILVER HALIDE PHOTOGRAPHIC LIGHT-SENSITIVE ELEMENT HAVING A LIGHT INSENSITIVE UPPER LAYER

FIELD OF THE INVENTION

This invention relates to a silver halide photographic light-sensitive material for photomechanical process, and to a method for reducing treatment using the same.

BACKGROUND OF THE INVENTION

In the graphic arts industries and the like, a light-sensitive material to make an original transparency signifies light-sensitive materials which are used for converting continuous-tone images of originals into halftone images or for photographing line originals or the like, which is involved in a photomechanical process.

In the usual production of printing plates utilizing such light-sensitive materials are described above, partial or overall minute retouch of image is carried out. This is done with the intention of reproducing the delicate tones of originals so that they have excellent printing characteristics or unsatisfying the artistic expression of the printed image. This is frequently carried out by subjecting these materials to a processing referred to as a reduction processing. This involves reducing the dot area of halftone images, or increasing or decreasing the width of line images, or so on.

Accordingly, whether or not the light-sensitive material has an aptitude for a reduction processing has become very important of such materials.

To subject a light-sensitive material for photomechanical process having a halftone image or a line image formed thereon through an exposure and development process, a method is used which comprises contacting metallic silver forming the halftone or line image with a reducer. Many kinds of reducers are known. For example, Mees, *The Theory of the Photographic Process*, pages 738–739 (1954, Macmillan Co.) describes reducers containing permanganates, ferric salts, ceric salts, potassium ferricyanide, persulfates and bichromates as reducing components.

Since the reducing treatment is after all the oxidation and dissolving of a silver image, when the dot area of a halftone image is decreased by the reducing treatment, the blackening density of the dots is simultaneously decreased. Accordingly, the range modifiable by the reducing treatment is restricted by the degree of decrease of the blackening density per dot which occurs during the decreasing of the dot area. In other words, the measure of the modifiable range of a halftone image can be expressed by the extent of the decrease of the dot area which can be effected while the blackening density per dot is maintained above a certain fixed value.

The extent to which the dot area has been decreased from that before treatment is determined when as a result of the reducing treatment, the blackening density of a dot is decreased to a minimum limit required in the photomechanical process, and this is expressed in the present specification as the "reduction extent". The larger the reduction extent, the higher is the adaptability of the light-sensitive material for photomechanical process to the reducing treatment.

As a technique for increasing adaptability to a reducing treatment, a method involving using a reducer containing a mercapto compound during the reducing treatment is known, as described, for example, in Japanese Patent Application (OPI) No. 68419/77 (the term "OPI" as used herein refers to a "published unexamined Japanese patent application"). The reducer thereof is special and difficult to use, because the rate of reduction differs from those of reducers generally used. If an emulsion film is rendered soft and the covering power and the density are increased, it is possible to increase the reduction extent and improve the reducing treatment characteristics. However, this method cannot provide the generally required film strength.

From a technical viewpoint, the most effective method among the techniques of increasing the reduction extent and improving the reducing treatment adaptability that have been known is to increase the amount of silver forming an image. This is because the modifiable range of the image by the reduction treatment becomes broader as the amount of silver forming the silver image per unit area is larger. Accordingly, the reduction extent can be broadened by increasing the amount of silver halide used in a light-sensitive material for photomechanical process per unit area. However, as is well known, silver is very expensive and valuable, thus increasing the amount of silver coated is undesirable in view of the cost of the resulting light-sensitive material for photomechanical process.

It is, therefore, one of the important problems in the art to produce light-sensitive materials for photomechanical process having desirable reducing characteristics as noted above while using as little silver as possible.

Japanese Patent Application (OPI) No. 42039/83, by the present applicant, has proposed that in order to solve the above problem, a light-sensitive upper layer having a longer melting time than the melting time of a silver halide emulsion layer be formed on the silver halide emulsion layer. By this means, the reducing treatment adaptability of the resulting light-sensitive material can be greatly improved without increasing the amount of silver coated. However, in order to increase the melting time of the light-insensitive upper layer, it must be hardened independently of the emulsion layer. Hence, it has been found that the coating of this layer is not sufficiently easy and care must be taken, or reticulation occurs.

SUMMARY OF THE INVENTION

It is a first object of this invention to provide a light-sensitive material for photomechanical process having improved adaptability to a reducing treatment.

A second object of this invention is to provide a light-sensitive material for photomechanical process whose adaptability to a reducing treatment is not deteriorated even when the amount of silver coated per unit area is decreased.

A third object of this invention is to provide a light-sensitive material for photomechanical process having improved adaptability to a reducing treatment which can be obtained by an easy coating operation without the occurrence of reticulation.

A further object of this invention is to provide a method of reducing treatment which can attain a large extent of reduction with a light-sensitive material for photomechanical process having a small amount of silver coated per unit area.

It has been found that the objects are attained by incorporating a special polymer as described hereinafter into a light-insensitive upper layer of a light-sensitive material for photomechanical process of the structure as described hereinafter.

The present invention relates to a light-sensitive material for photomechanical process comprising a support, at least one light-sensitive silver halide emulsion layer on the support, and at least one light-insensitive upper layer on the light-sensitive silver halide emulsion layer, wherein at least one light-insensitive upper layer contains a polymer comprising:

(a) a monomer unit containing at least one group having an electric charge; and (b) at least 0.1 mol% of a monomer unit containing a functional group capable of cross-linking through a gelatin hardening agent with a like functional group of another polymer chain of the same type or with gelatin.

The present invention also relates to a method of the reducing treatment of a light-sensitive material for photomechanical process of the same structure as above, which method comprises, after subjecting the material to a photographic processing including imagewise exposure and development to form thereon a silver image, applying a reducing solution through the light-insensitive upper layer containing a polymer as described above onto the silver image formed in the light-sensitive material for photomechanical process.

DETAILED DESCRIPTION OF THE INVENTION

The exact reason why improved reducing treatment adaptability is obtained according to the present invention has not yet been clarified. However, based on the fact that the effects of the present invention cannot be obtained with polymers not containing the monomer unit (a), it is believed that the electric charge density of the light-insensitive upper layer, which is increased upon addition of the polymer of the present invention as compared with the emulsion layer, plays a significant role.

The proportion of monomer unit (a) in the polymer of the present invention is preferably 10 mol% or more and more preferably from 60 to 98 mol%.

The monomer unit (a) is a monomer unit resulting from copolymerization of an ethylenically unsaturated monomer and has an electric charge. Functional groups having an electric charge include groups containing an anionic charge (e.g., sulfonic acid, phosphoric acid, carboxylic acid, and their salts), groups containing a cationic charge (e.g., primary, secondary, tertiary and quaternary ammonium salts, guanidine salts, and imidine salts), and groups containing an amphoteric charge (e.g., sulfobetaine and carboxybetaine). Of these groups, groups containing an anionic or amphoteric charge are preferred. More preferred are groups containing an anionic charge.

Preferred examples of the monomer unit (a) are monomer units represented by the general formula (I):

wherein R is a hydrogen atom or a lower alkyl group (e.g, a methyl group, an ethyl group, and a butyl group), A is a divalent connecting group (e.g., a phenylene group and an alkylenecarbamoyl group), X is a functional group having an electric charge as described above, and n is 0 or 1.

Many polymers consisting of the monomer unit (a) alone are water-soluble, and, if coated, can easily migrate from layer to layer. With these polymers, therefore, the objects of the present invention cannot be attained. Thus, in accordance with the present invention, the monomer unit (b) is incorporated as another polymer component, so that the resulting polymer can be secured in the light-insensitive upper layer. For this purpose, it is necessary for the monomer unit (b) to be present in a proportion of at least 0.1 mol%. The proportion of monomer unit (b) is preferably from 2 to 40 mol%.

The monomer unit (b) contains a functional group capable of cross-linking through a gelatin hardening agent with a like functional group of another polymer chain of the same type or with gelatin. In other words, it is a monomer unit resulting from copolymerization of an ethylenically unsaturated monomer and containing a functional group capable of cross-linking through a gelatin hardening agent with a like functional group of another polymer chain of the same type or with gelatin. This functional group is nucleophilic, and as functional groups of this type, there are various known groups. As a matter of course, groups of high reactivity with a gelatin hardening agent are preferred. For this viewpoint, for the monomer unit (b), the dissociation constant (pKa) of the functional group is preferably not more than 9.5, and more preferably not more than 8.5.

More particularly, the monomer unit (b) preferably has a sulfinic acid group or a primary amino group as the cross-linkable functional group. It is especially preferred for the monomer unit (b) to have a sulfinic acid group as the functional group.

Preferred examples of the monomer unit (b) are monomer units represented by formula (II):

wherein R and A are the same as defined for formula (I), Y is a functional group capable of cross-linking through a gelatin hardening agent with a like functional group of another polymer chain of the same type or with gelatin (e.g., a sulfinic acid group and a primary amino group), and n is 0 or 1.

In addition to the monomer units (a) and (b), the polymer of the present invention may contain a monomer unit derived by copolymerizing other ethylenically unsaturated monomers. The proportion of this monomer unit is preferably not more than 40 mol%.

The molecular weight of the polymer of the present invention is preferably from $1 \times 10^4$ to $1 \times 10^7$. If the molecular weight is too small, the reduction effect is decreased, whereas if it is too large, some difficulties may be encountered in coating. More preferably the molecular weight is from $1 \times 10^5$ to $2 \times 10^6$.

The amount of the polymer of the present invention being used should be determined appropriately from polymer to polymer taking into consideration the reduction effect (i.e., the effect of increasing the reduction extent) and the influence on the reduction time. In general, if the polymer of the present invention is used in an amount of at least 3% by weight based on the weight of a binder (at least 2% by weight when calculated as the amount of the monomer unit (a) in the polymer), the desired reduction effect can be obtained. If, however, the amount of the polymer of the present invention exceeds a certain level, no additional reduction effect can be obtained and, on the contrary, the time required for reduction is unnecessarily lengthened. Usually, therefore, the polymer of the present invention is sufficiently added in an amount of 100% by weight or less based on the weight of the binder (90% by weight or less when calculated as the amount of the monomer unit (a) in the polymer). Especially preferably the amount of the polymer used is from 5 to 33.3% by weight based on the weight of the binder (from 4.5 to 30% by weight when calculated as the monomer unit (a) in the polymer).

Representative examples of preferred polymers which can be used in the present invention are shown below.

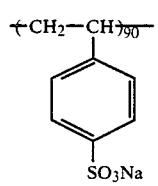 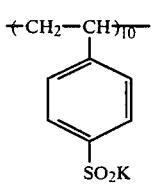 P-1

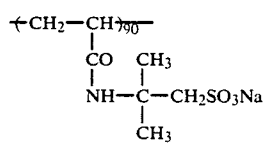 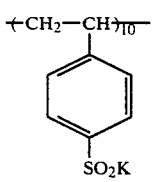 P-2

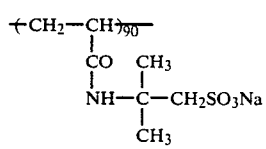 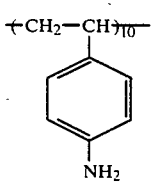 P-3

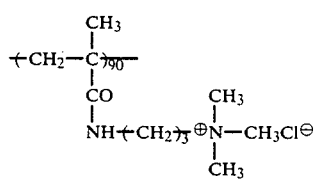 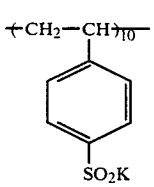 P-4

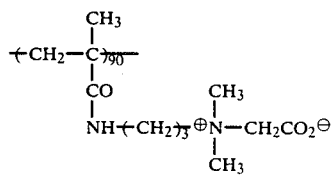 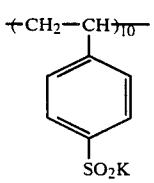 P-5

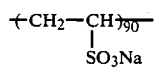 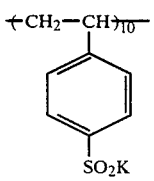 P-6

The above-described polymers are known and can be synthesized by, for example, procedures as described in Japanese Patent Application (OPI) Nos. 73625/75 and 4141/81.

Examples of preparation of some polymers which are used in the present invention are shown below.

PREPARATION EXAMPLE 1

Preparation of Poly(sodium 2-acrylamide-2-methylpropanesulfonate-co-potassium vinylbenzenesulfinate) (Polymer P-2)

A reactor was charged with 745.2 g of 2-acrylamide-2-methylpropanesulfonic acid, 0.67 g of hydroquinone monomethyl ether, and 2,000 g of distilled water. In addition, 144 g of sodium hydroxide dissolved in 1,400 g of distilled water was added and then 82.4 g of potassium vinylbenzenesulfinate was added. The resulting mixture was heated to 60° C. Then, 10.84 g of a compound having the formula as shown below (V-50, produced by Wako Junyaku Co., Ltd.) was dissolved in 314 ml of distilled water and added to the above-prepared mixture. The resulting mixture was heated for 5 hours to yield a colorless, transparent viscous solution.

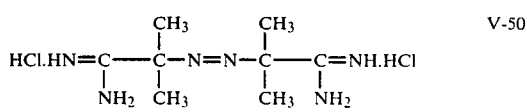 V-50

For this viscous solution, the solids content was 20.8% by weight, pH=5.43, the solution viscosity at 25° C. was 710 cp, and the molecular weight as determined by the light scattering method was about 990,000.

PREPARATION EXAMPLE 2

Preparation of Poly(methacrylamide-3-(N,N,N-trimethylammonio)-propyl chloride-co-potassium vinylbenzenesulfinate) (Polymer P-4)

A reactor was charged with 99.2 g of methacrylamide-3-(N,N,N-trimethylammonio)propyl chloride, 10.3 g of potassium vinylbenzenesulfinate, and 350 g of distilled water. The mixture was heated to 60° C. Then, 1.36 g of V-50 dissolved in 89 g of distilled water was added to the mixture. The resulting mixture was heated for 5 hours to yield a colorless, transparent viscous solution.

For this viscous solution, the solids content was 20.3% by weight, pH=5.70, the solution viscosity at 25° C. was 596 cp, and the molecular weight as determined by the light scattering method was about 1,000,000.

PREPARATION EXAMPLE 3

Preparation of Poly(methacrylamide-3-(N,N-dimethyl-N-carboxymethylammonio)propyl-co-potassium vinylbenzenesulfinate) (Polymer P-5)

A reactor was charged with 96.3 g of methacrylamide-3-(N,N-dimethyl-N-carboxymethylammonio)propyl, 10.3 g of potassium vinylbenzenesulfinate, and 350 g of distilled water. The mixture was heated to 60° C. Then, 1.36 g of V-50 dissolved in 76 g of distilled water was added to the mixture. The mixture was then heated for 5 hours to yield a colorless, transparent viscous solution.

For this viscous solution, the solids content was 22.8% by weight, pH=8.1, and the solution viscosity at 25° C. was 376 cp.

The polymer of the present invention is water-soluble and can be easily mixed with gelatin which is a binder for the light-insensitive upper layer. Thus, the polymer of the present invention is advantageous in that it does not need special operations such as emulsification and dispersion. The polymer of the present invention reacts with a gelatin hardening agent in the light-insensitive upper layer, cross-linking through the gelatin hardening agent with a like functional group of another polymer chain of the same type or with gelatin, whereupon the polymer is immobilized in the light-insensitive upper layer. Since the polymer of the present invention, as described above, does not react directly with gelatin, it is free from the problem that the characteristics of a mixture of the polymer of the present invention and a gelatin solution change with time, thereby making difficult the coating operation. Furthermore, the polymer of the present invention does not unnecessarily harden the light-insensitive upper layer, and therefore the formation of reticulation can be prevented.

Gelatin hardening agents which can be used in the present invention include aldehydes (e.g., formaldehyde, glyoxal, and glutaraldehyde), N-methylol compounds (e.g., dimethylolurea and methyloldimethylhydantoin), dioxane derivatives (e.g., 2,3-dihydroxydioxane), active vinyl compounds (e.g., 1,3,5-triacryloyl-hexahydroxy-s-triazine, bis(vinylsulfonyl)methyl ether, and N,N'-ethylene-bis(vinylsulfonylacetamide)), active halogen compounds (e.g., 2,4-dichloro-6-hydroxy-s-triazine), mucohalogenic acids (e.g., mucochloric acid and mucophenoxychloric acid), isooxazoles, dialdehyde starch, and 1-chloro-6-hydroxytriazinylated gelatin). Typical examples of these compounds are described, for example, in U.S. Pat. Nos. 1,870,354, 2,080,019, 2,726,162, 2,870,013, 2,983,611, 2,992,109, 3,047,394, 3,057,723, 3,103,437, 3,321,313, 3,325,287, 3,362,827, 3,490,911, 3,539,644 and 3,543,292, British Pat. Nos. 676,628, 825,544 and 1,270,578, German Pat. Nos. 872,153, 1,090,427 and 2,749,260, and Japanese Patent Publication Nos. 7133/59 and 1872/71.

Of these hardening agents, active vinyl compounds and active halogen compounds are especially preferred.

The hardening agent may be added to a coating solution for the light-insensitive upper layer, or it may be added to a coating solution for the light-sensitive silver halide emulsion layer, so that it can diffuse into the light-insensitive upper layer when the light-sensitive silver halide emulsion layer comes into contact with the light-insensitive upper layer.

The amount of the gelatin hardening agent used in the present invention can be determined appropriately depending on the purpose. Usually the gelatin hardening agent is used in an amount of from 0.01 to 20% by weight based on the weight of dry gelatin. It is especially preferred to use the gelatin hardening agent in an amount of from 0.1 to 10% by weight based on the weight of dry gelatin. If the amount of the gelatin hardening agent used based on the weight of dry gelatin is in excess of 20% by weight, the resulting aqueous gelatin solution undergoes gelation and is hardened. Thus a film cannot be formed by applying the aqueous gelatin solution by techniques such as coating and spray coating. On the other hand, if the amount of the gelatin hardening agent used is less than 0.01% by weight, although a film can be formed by applying the resulting aqueous gelatin solution, the film is not sufficiently hardened even after drying and thus it has only an insufficient strength.

Gelatin as used in the light-insensitive upper layer of the present invention may be any of a so-called alkali-treated (lime-treated) gelatin which is prepared soaking in an alkali bath prior to extraction of gelatin, an acid-treated gelatin which is prepared by soaking in an acid bath, and an enzyme-treated gelatin as described in *Bull. Soc. Sci. Photo. Japan.*, No. 16, page 39 (1966). In addition, a low molecular weight gelatin can be used, which is prepared by heating gelatin in a water bath or allowing a proteinase to act thereon, thereby partially hydrolyzing it.

If desired, a part of the above-described gelatin may be replaced by cellulose derivatives such as colloidal albumin, casein, carboxymethyl cellulose, and hydroxyethyl cellulose; saccharide derivatives such as agar, sodium alginate, and starch derivatives; synthetic hydrophilic colloids such as polyvinyl alcohol, poly(N-vinylpyrrolidone), acrylic acid copolymers, polyacrylamide or their derivatives, partially hydrolyzed products, etc.; and furthermore, by so-called gelatin derivatives prepared by treating or modifying the functional groups contained in the gelatin molecule, such as an amino group, an imino group, a hydroxyl group, and a carboxyl group, with a reagent having one group capable of reacting with the functional group; and graft polymers prepared by graft copolymerization of molecular chains of other polymeric substances on gelatin.

Reagents which can be used in the preparation of derivatives as described above include isocyanates, acid chlorides, and acid anhydrides as described in U.S. Pat. No. 2,614,928, acid anhydrides as described in U.S. Pat. No. 3,118,766, bromoacetic acids as described in Japanese Patent Publication No. 5514/64, phenyl glycidyl ethers as described in Japanese Patent Publication No. 26845/67, vinyl sulfon compounds as described in U.S. Pat. No. 3,132,945, N-allyl vinyl sulfoamides as described in British Pat. No. 861,414, maleinimide compounds as described in U.S. Pat. No. 3,186,846, acrylonitriles as described in U.S. Pat. No. 2,594,293, polyalkylene oxides as described in U.S. Pat. No. 3,312,553, epoxy compounds as described in Japanese Patent Publication No. 26845/67, acid esters as described in U.S. Pat. No. 2,763,639, and alkanesultones as described in British Pat. No. 1,033,189.

The light-sensitive material for photomechanical process in this invention is a light-sensitive material used in the printing industry for printing halftone images or line images by a photomechanical process, and is not particularly limited in kind and performance. The generally used light-sensitive material is a high-contrast light-sensitive material such as a so-called lith film.

Accordingly, there is not particular limitation on the silver halide used in the photosensitive silver halide emulsion layer of the light-sensitive material for photomechanical process of this invention. For example, silver chlorobromide, silver chloroiodobromide, silver iodobromide and silver bromide can be used. Silver chlorobromide or silver chloroiodobromide containing at least 60 mol%, and preferably at least 75 mol%, of silver chloride, and 0 to 5 mol% of silver iodide, is preferred. The form, crystal habit, size distribution, etc., of the silver halide grains are not particularly restricted, but the grain size is preferably not more than 0.7 micron.

The sensitivity of the silver halide emulsion can be increased, without making its grains coarse, by using a reducing substance, for example, a gold compound such as a chloroaurate or gold trichloride, a salt of a noble metal such as rhodium or iridium, a sulfur compound capable of forming silver sulfate upon reaction with a silver salt, a stannous salt, or an amine.

It is also possible to use a salt of a noble metal such as rhodium or iridium, potassium ferricyanide, etc., during the physical ripening of the silver halide grains, or during the formation of a nucleus.

Gelatin can be advantageously used as the hydrophilic colloid binder used in the light-sensitive silver halide emulsion layer or layers other than the light-insensitive upper layer in the light-sensitive material for photomechanical process of this invention. Other hydrophilic colloids may also be used.

Examples of the other hydrophilic colloids include proteins such as gelatin derivatives, graft polymers of gelatin with other polymers, albumin and casein; cellulose derivatives such as hydroxyethyl cellulose, carboxymethyl cellulose and cellulose sulfate esters; sugar derivatives such as sodium alignate and starch derivatives; and various synthetic hydrophilic polymers such as polyvinyl alcohol, partially acetalized product of polyvinyl alcohol, poly-N-vinylpyrrolidone, polyacrylic acid, polymethacrylic acid, polyacrylamide, polyvinylimidazole and polyvinylpyrazole and the corresponding copolymers.

Gelatin may be lime-treated gelatin, acid-treated gelatin, or the enzyme-treated gelatins described in *Bull. Soc. Sci. Photo. Japan*, No. 16, page 30 (1966). Hydrolyzed or enzymatically decomposed products of gelatin can also be used.

For the purpose of increasing the dimensional stability of the light-sensitive material, improving film properties, etc., the silver halide emulsion layer or other layers may contain polymer latexes composed of homopolymers or copolymers of alkyl acrylates, alkyl methacrylates, acrylic acid, glycidyl acrylate, etc., which are described in U.S. Pat. Nos. 3,142,568, 3,325,286, 3,411,911, 3,411,912 and 3,547,650, and Japanese Patent Publication No. 5331/70.

As antifogging agents for the emulsion, there can be used, for example, 4-hydroxy-6-methyl-1,3,3a,7-tetraazaindene, 3-methylbenzothiazole, 1-phenyl-5-mercaptotetrazole, many other heterocyclic compounds, mercury-containing compounds, mercapto compounds, and antifogging agents well known in the art as described, for example, in Japanese Patent Application (OPI) Nos. 81024/74, 6306/75 and 19429/75 and U.S. Pat. No. 3,850,639.

Surface active agents may be added to the silver halide emulsion layer in this invention as a coating aid or in order to improve photographic properties.

Examples of preferred surface active agents include natural surface active agents such as saponin; nonionic surface active agents such as the alkylene oxide and glycidol types; anionic surface active agents containing acidic groups such as a carboxyl group, a sulfo group (e.g., the surface agents described in U.S. Pat. No. 3,415,649), a phospho group, a sulfate group, or a phosphate group; and amphoteric surface active agents such as amino acids, aminosulfonic acids, and sulfate or phosphate esters of aminoalcohols.

The polyalkylene oxide compounds used in this invention include condensation products of a polyalkylene oxide containing at least 10 units of an alkylene oxide having from 2 to 4 carbon atoms (such as ethylene oxide, propylene-1,2-oxide and butylene-1,2-oxide, preferably ethylene oxide) with a compound containing at least one active hydrogen atom (such as water, an aliphatic alcohol, an aromatic alcohol, a fatty acid, an organic amine, an organic amide and a hexitol), or block copolymers of at least two kinds of polyalkylene oxides. Thus, specifically, polyalkylene oxide compounds that can be used are polyalkylene glycols, polyalkylene glycol alkyl ethers, polyalkylene glycol aryl ethers, polyalkylene glycol alkyl esters, polyalkylene glycol aryl esters, polyalkylene glycol fatty acid amides, polyalkylene glycol amines, polyalkylene glycol block copolymers, and polyalkylene glycol graft polymers.

Specific examples of polyalkylene oxide compounds that can be preferably used in this invention are listed below.

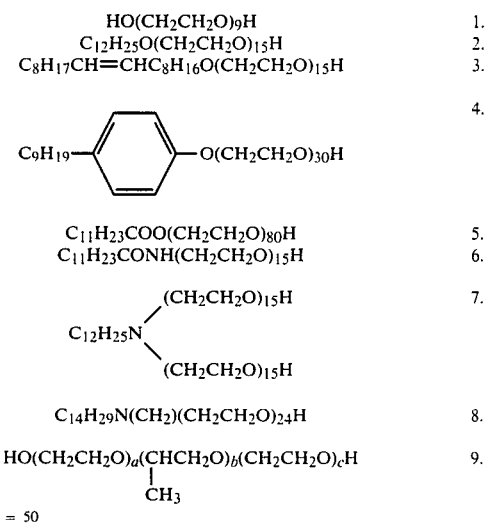

1. $HO(CH_2CH_2O)_9H$
2. $C_{12}H_{25}O(CH_2CH_2O)_{15}H$
3. $C_8H_{17}CH{=}CHC_8H_{16}O(CH_2CH_2O)_{15}H$
4. $C_9H_{19}\text{—}C_6H_4\text{—}O(CH_2CH_2O)_{30}H$
5. $C_{11}H_{23}COO(CH_2CH_2O)_{80}H$
6. $C_{11}H_{23}CONH(CH_2CH_2O)_{15}H$
7. $C_{12}H_{25}N\big({(CH_2CH_2O)_{15}H}\big)_2$
8. $C_{14}H_{29}N(CH_2)(CH_2CH_2O)_{24}H$
9. $HO(CH_2CH_2O)_a(CHCH_2O)_b(CH_2CH_2O)_cH$
   $\quad\quad\quad\quad\quad\quad\quad\; |$
   $\quad\quad\quad\quad\quad\quad\quad CH_3$ $a + b + c = 50$
$b{:}a + c = 10{:}9$ The weight ratio of the silver halide to the hydrophilic colloid binder in the silver halide emulsion layer in this invention is preferably ½ or less.

In this invention, the number of the silver halide emulsion layers is not limited to 1, and may be 2 or more.

For example, when there are two silver halide emulsion layers, the total weight ratio of silver halide to hydrophilic colloid binder in the two layers is ½ or less. Preferably, the upper silver halide emulsion layer contains more hydrophilic colloid binder than the lower silver halide emulsion layer.

The amount of silver halide coated is preferably from 1.0 to 6.0 g, and more preferably from 1.5 to 4.0 g, per m² calculated as silver.

The effect of this invention is especially remarkable when the amount of silver coated is small.

The light-insensitive upper layer in this invention may include a surface active agent, an antistatic agent, a matting agent, a lubricant, colloidal silica, a gelatin plasticizer, a polymer latex, etc., in addition to the hydrophilic colloid binder (such as gelatin).

Polymethyl methacrylate and silicon dioxide in a particle diameter of from 0.1 to 10 microns, and particularly about 1 to 5 microns, are preferred as the matting agent.

A polyester film such as a polyethylene terephthalate film and a cellulose ester film such as a cellulose triacetate film are preferably used as the support of the light-sensitive material for photomechanical process of this invention.

Imagewise exposure to obtain an image may be carried out by ordinary methods. There can be used various light sources such as natural light (sunlight), a tungsten lamp, a fluorescent lamp, a mercury vapor lamp, a xenon lamp, an arc lamp, a carbon arc light, a xenon flash lamp and a cathode ray tube flying spot. The exposure time may be from 1/1,000 second to 1 second employed in ordinary cameras. Of course, the exposure time may be shorter than 1/1,000 second, for example, from $1/10^4$ to $1/10^6$ second, by using a xenon flash lamp or a cathode ray tube, or longer than 1 second. If desired, the spectral composition of light used for exposure may be adjusted by a color filter. A laser light can also be used for exposure.

There is no particular restriction on the method of developing the light-sensitive material for photomechanical process of this invention, and methods which are usually employed for processing light-sensitive materials for photomechanical process can be used. The processing temperature is usually selected between 18° C. and 50° C., but may be lower than 18° C. or higher than 50° C.

The developing solution may contain any known developing agent selected, for example, from dihydroxybenzenes (such as hydroquinone), 3-pyrazolidones (such as 1-phenyl-3-pyrazolidone), aminophenols (such as N-methyl-p-aminophenol), 1-phenyl-3-pyrazolines, ascorbic acid, and the heterocyclic compounds in which a 1,2,3,4-tetrahydroquinoline ring is fused with an indolenine ring as described in U.S. Pat. No. 4,067,872, either singly or in combination. The developing solution generally contains known preservatives, alkaline agents, pH buffers, antifogging agents, etc., and optionally a dissolution aid, a toning agent, a development promoter, a surface active agent, a defoaming agent, a water softening agent, a hardener, a viscosity imparting agent, etc.

A lithographic developing solution is especially preferred for use in this invention. Basically, it is composed of o- or p-dihydroxybenzene, an alkaline agent, a small amount of a free sulfite salt, and a small amount of a sulfite ion buffer, etc. The o- or p-dihydroxybenzene as a developing agent can be properly selected from those well known in the photographic field. Specific examples include hydroquinone, chlorohydroquinone, bromohydroquinone, isopropylhydroquinone, toluhydroquinone, methylhydroquinone, 2,3-dichlorohydroquinone and 2,5-dimethylhydroquinone. Of these, hydroquinone is particularly practical.

These developing agents may be used singly or as a mixture. The amount of the developing agent is 1 to 100 g, preferably 5 to 80 g, per liter of the developing solution. The sulfite ion buffer is used in an amount effective for maintaining the concentration of the sulfite salt in the developing solution at a nearly fixed value. Examples of the sulfite ion buffer are aldehyde/alkali hydrogen sulfite adducts such as formaldehyde/sodium hydrogen sulfite adduct, ketone/alkali hydrogen sulfite adducts such as acetone/sodium hydrogen sulfite adduct, and carbonyl bisulfite/amine condensation products such as sodium-bis(2-hydroxyethyl)aminomethane sulfonate. The amount of the sulfite ion buffer used is generally from 13 to 130 g per liter of the developing solution.

The free sulfite ion concentration of the developing solution used in this invention may be adjusted by adding an alkali sulfite such as sodium sulfite. The amount of the sulfite is generally not more than 5 g (although it may be larger), and preferably not more than 3 g, per liter of the developing solution.

In many cases, it is preferred to include an alkali halide (especially a bromide such as sodium or potassium bromide) as a development control agent. The amount of the alkali halide is preferably from 0.01 to 10 g, and especially preferably from 0.1 to 5 g, per liter of the developing solution.

An alkaline agent is added to adjust the pH of the developing solution to at least 9, and preferably to from 9.7 to 11.5. Sodium carbonate or potassium carbonate in varying amounts may be used as the alkaline agent as in normal developing solutions.

A fixing solution of a conventional composition may be used.

Thiosulfates, thiocyanates, and organic sulfur compounds known to have an effect of a fixing agent may be used as the fixing agent.

The fixing solution may contain a water-soluble aluminum salt as a hardener. A customary method can be applied when a color image is to be formed.

The development may be carried out by a hand operation or by using an automatic processor. When the automatic processor is to be used, there is no particular restriction on the method of conveying (for example, roller conveying, belt conveying, etc.), and any conveying-type automatic processor used in the art can be used. For the composition of the processing solution and the method of development, reference may be made to the disclosures of U.S. Pat. Nos. 3,025,779, 3,078,024, 3,122,086, 3,149,551, 3,156,173, 3,224,356 and 3,573,914. For the silver halide emulsion layer, the other layers and the support of the light-sensitive material for photomechanical process of this invention, the method of processing it, etc., reference may be made to the description of *Research Disclosure*, Vol. 176, pages 22–28, December 1978.

There is no particular limitation on the reducer used in this invention. For example, there can be used the reducers described in Mees, *The Theory of the Photographic Process*, pages 738–739 (1954), Macmillan Co., Tetsuo Yano, *Photographic Processing, Its Theory and Application* (Japanese language publication published by Kyoritsu Shuppan K.K., Japan, 1978), and Japanese Patent Application (OPI) Nos. 27543/75, 140733/76, 68429/77, 14901/78, 119236/79, 119237/79, 2245/80, 2244/80, 17123/80, 79444/80 and 81344/80.

Specifically, reducers may be used containing permanganates, persulfates, ferric salts, cupric salts, ceric salts, potassium ferricyanide and bichromate salts either alone or in combination as an oxidizing agent and if desired, an inorganic acid such as sulfuric acid and an alcohol; or reducers containing such an oxidizing agent as potassium ferricyanide or ferric ethylenediaminetetraacetate, a solvent for silver halide such as a thiosulfuric acid salt, a rhodanate, thiourea or derivatives thereof, and if desired, an inorganic acid such as sulfuric acid.

Typical examples of the reducer used in this invention include the Farmer's reducer, a ferric ethylenediaminetetraacetate reducer, a potassium permanganate/ammonium persulfate reducer (e.g., Kodak R-5), and a ceric salt reducer.

The light-sensitive material of this invention for photomechanical process is especially effective for a reducing treatment with a ceric salt reducer. Thus, the use of a reducer containing toxic potassium ferricyanide is no longer necessary. This is one advantage of this invention.

The ceric salt reducer usually contains from 10 to 130 g, especially 20 to 70 g, per liter of the reducer of a ceric salt such as ceric sulfate, ceric acetate, ceric ammonium nitrate and ceric potassium nitrate, and an acid (either an organic or inorganic acid such as sulfuric acid, nitric acid, phosphoric acid or acetic acid; the preferred amount is not more than 1.0N per liter of the reducer) and if desired, an alcohol, a glycol, a mercapto compound, a surface active agent, or a thickener (such as hydroxyethyl cellulose).

The reducing treatment is generally carried out at from 10° to 40° C., and preferably at from 15° to 30° C., and is preferably completed within several seconds to up to about ½ hour, preferably within several minutes. With the light-sensitive material for photomechanical process of this invention, a sufficiently large reduction extent can be obtained under those reducing conditions.

The reducer acts on the silver image formed in the emulsion layer through the light-insensitive upper layer containing the compound specified in this invention. This can be effected by various methods. For example, the light-sensitive material for photomechanical process can be immersed in the reducer and the reducer is stirred. Or the reducer can be applied to the surface of the light-insensitive upper layer side of the light-sensitive material for photomechanical process by a brush, a roller, etc.

The following Example illustrate the present invention more specifically.

EXAMPLE

A silver halide emulsion composed of 80 mol% of silver chloride, 19.5 mol% of silver bromide, and 0.5 mol% of silver iodide was prepared in the customary manner using gold sensitization and sulfur sensitization. The amount of gelatin contained in the emulsion was 45% by weight based on the weight of silver halide. To this emulsion, 3-carboxymethyl-5-[2-(3-ethyl-thiazolinylidene)ethylidene]rhodanine (spectral sensitizer), 4-hydroxy-1,3,3a,7-tetrazaindene (stabilizer), polyoxyethylene nonylphenyl ether containing 50 ethylene oxide groups, and a polymer latex as described in Preparation Example 3 of Japanese Patent Publication No. 5331/70 (corresponding to U.S. Pat. No. 3,525,620) were added in turn and, thereafter, N,N'-ethylene-bis(-vinylsulfonylacetamide) (hardening agent) was added thereto in an amount as indicated hereinafter to prepare a coating solution for a light-sensitive silver halide emulsion layer.

A coating solution for a light-insensitive upper layer was prepared by adding a polymer of the present invention to an aqueous gelatin solution in an amount as shown in Table 1. In addition, a comparative coating solution was prepared by adding a polymer (HP-1) made up of only a monomer unit having a charged group in an amount as shown also in Table 1.

The above-prepared coating solutions for the light-sensitive emulsion layer and light-insensitive upper layer were coated simultaneously on a polyethylene terephthalate film support to prepare a light-sensitive material for photomechanical process. In this way, light-sensitive samples Nos. 1 to 8 were prepared.

The amount of silver coated was 2.6 g/m², and the amount of gelatin coated in the light-insensitive upper layer was 1.1 g/m².

In Table 1, P-2, P-4 and P-5 are the polymer of the present invention as described above in detail, and HP-1, CP-1 and CP-2 are as follows.

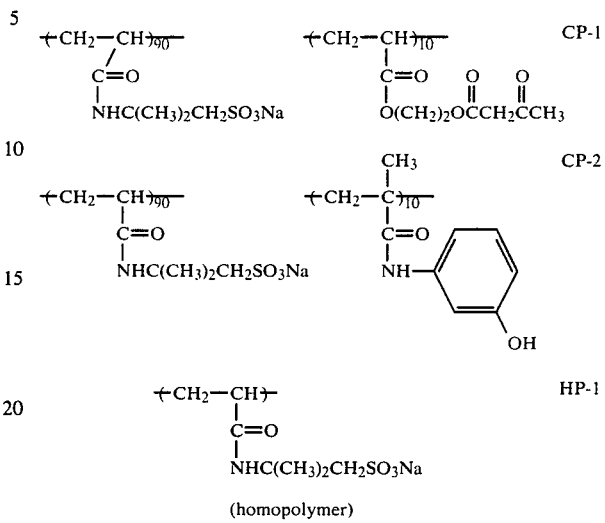

TABLE 1

| Sample No. | Amount of Hardening Agent added (g/m²) | Polymer Type | Polymer Amount (g/m²) | Degree of Swelling (H₂O, 25° C.) | Remarks |
|---|---|---|---|---|---|
| 1 | 0.063 | — | — | 1.10 | Control |
| 2 | " | P-2 | 0.060 | 1.14 | Invention |
| 3 | " | " | 0.120 | 0.97 | " |
| 4 | " | " | 0.240 | 1.33 | " |
| 5 | " | P-4 | 0.059 | 1.11 | " |
| 6 | " | " | 0.117 | 1.03 | " |
| 7 | " | P-5 | 0.056 | 1.06 | " |
| 8 | " | " | 0.225 | 1.26 | " |
| 9 | " | HP-1 | 0.055 | 0.97 | Comparison |
| 10 | " | " | 0.110 | 1.00 | " |
| 11 | " | CP-1 | 0.250 | 1.18 | Invention |
| 12 | " | CP-2 | 0.240 | 1.24 | " |

Note:
*The degree of swelling is represented by d + Δd/d where d is the total thickness of the silver halide emulsion layer and light-insensitive upper layer at room temperature (25 C., 60% RH), and Δd is the increase in the thickness when the light-sensitive material is swollen to the maximum degree of swelling by dipping in distilled water maintained at 25° C.

A halftone image was formed in each light-sensitive sample by the following procedure.

A negative gray contact screen (made by DAI-NIPPON SCREEN Co., Ltd.) (150 line/inch) was brought into intimate contact with the light-sensitive sample, which was then exposed for 10 seconds to white tungsten light through a step wedge of step difference 0.1. This sample was developed with a lithographic developer as described below at 20° C. for 3 minutes, and, thereafter, fixed, washed with water and dried in the customary manner.

| Developer | Amount (g) |
|---|---|
| Sodium carbonate (monohydrate) | 50 |
| Formaldehyde/hydrogensulfite adduct | 45 |
| Potassium bromide | 2 |
| Hydroquinone | 18 |
| Sodium sulfite | 2 |
| Water to make | 1 liter |

The thus-prepared halftone strips were soaked in a reducing solution as described below at 20° C. for 20 to 100 seconds and then washed with water.

| Reducing Solution | Amount (g) |
| --- | --- |
| Ceric sulfate | 25 |
| Concentrated sulfuric acid | 30 |
| Water to make | 1 liter |

Changes in the dot area of the resulting halftone strips and changes in density for each dot were measured by a microdensitometer.

Dots of the halftone strips which had a dot area of 50% were subjected to the reducing treatment until the density of each of the dots became 2.5. The dot area of the halftone strips at this time, and the reducing time required for it, and the reduction extent are summarized in Table 2.

TABLE 2

| Sample No. | Before Reduction Dot Area (%) | Before Reduction Dot Density | After Reduction Dot Area (%) | After Reduction Dot Density | Reduction Time (seconds) | Reduction Extent (%) | Remarks |
| --- | --- | --- | --- | --- | --- | --- | --- |
| 1 | 50 | more than 4.0 | 43.9 | 2.5 | 36 | 6.1 | Control |
| 2 | " | more than 4.0 | 40.3 | " | 45 | 9.7 | Invention |
| 3 | " | more than 4.0 | 43.2 | " | 43 | 6.8 | Invention |
| 4 | " | more than 4.0 | 41.3 | " | 42 | 8.7 | Invention |
| 5 | " | more than 4.0 | 41.3 | " | 32 | 8.7 | Invention |
| 6 | " | more than 4.0 | 42.5 | " | 32 | 7.5 | Invention |
| 7 | " | more than 4.0 | 42.4 | " | 34 | 7.6 | Invention |
| 8 | " | more than 4.0 | 41.0 | " | 41 | 9.0 | Invention |
| 9 | " | more than 4.0 | 43.9 | " | 36 | 6.1 | Comparison |
| 10 | " | more than 4.0 | 43.8 | " | 30 | 6.2 | Comparison |
| 11 | " | more than 4.0 | 43.7 | " | 28 | 6.3 | Invention |
| 12 | " | more than 4.0 | 43.6 | " | 32 | 6.4 | Invention |

As is apparent from Table 2, Samples 2 to 8 prepared using the polymers of the present invention have greater reduction extents than Control Sample (Sample 1), and Samples 11 and 12 are less improved than Samples 2 to 8.

This demonstrates that as the functional group cross-linking with a like functional group of another polymer chain of the same type or gelatin through a gelatin hardening agent, such groups as a sulfinic acid group which are nucleophilic and have pKa of less than 9.5 (Samples 2 to 8) are superior to such groups as an active methylene group and a phenolic hydroxy group which have a pKa of more than 9.5 (Samples 11 and 12).

The reduction extents of Comparative Samples 9 and 10 are smaller than those of Samples 2 and 3 prepared using the polymer of the present invention (Polymer P-2). This demonstrates that it is necessary for the polymer of the present invention to contain a monomer unit having a functional group capable of cross-linking through a gelatin hardening agent with a like functional group of another polymer chain of the same type or with gelatin.

While the invention has been described in detail and with reference to specific embodiments thereof, it will be apparent to one skilled in the art that various changes and modifications can be made therein without departing from the spirit and scope thereof.

What is claimed is:

1. A silver halide photographic light-sensitive element for use in a photomechanical process comprising a support, at least one light-sensitive silver halide emulsion layer on the support, and at least one light-insensitive upper layer on the light-sensitive silver halide emulsion layer, wherein at least one light-insensitive upper layer contains a binder, a gelation hardening agent and a polymer comprising:

(a) at least 10 mol% of a monomer unit containing at least one group having an electric change, wherein said group is selected from groups which contain an anionic charge, a cationic charge and an amphoteric charge; and (b) at least 0.1 mol% of a monomer unit having a functional group capable of cross-linking through a gelatin hardening agent with a like functional group of another polymer chain of the same type or with gelatin, wherein said functional group is a nucleophillic group, wherein the light-insensitive upper layer contains the polymer in an amount of 3 to 100% by weight based on the weight of the binder.

2. A light-insensitive element as in claim 1, wherein the monomer unit (b) has a functional group which has a pKa of not more than 9.5 and is nucleophilic.

3. A light-sensitive element as in claim 1, wherein the monomer unit (b) has a functional group which has a pKa of not more than 8.5 and is nucleophilic.

4. A light-sensitive element as in claim 1, wherein the proportion of monomer unit (a) in the polymer is from 60 to 98 mol%.

5. A light-sensitive element as in claim 2, wherein the proportion of monomer unit (a) in the polymer is from 60 to 98 mol%.

6. A light-sensitive element as in claim 3, wherein the proportion of monomer unit (a) in the polymer is from 60 to 98 mol%.

7. A light-sensitive element as in claim 1, wherein the proportion of monomer unit (b) is from 2 to 40 mol%.

8. A light-sensitive element as in claim 2, wherein the proportion of monomer unit (b) is from 2 to 40 mol%.

9. A light-sensitive element as in claim 3, wherein the proportion of monomer unit (b) is from 2 to 40 mol%.

10. A light-sensitive element as in claim 4, wherein the proportion of monomer unit (b) is from 2 to 40 mol%.

11. A light-sensitive element as in claim 1, wherein the functional group of monomer unit (b) is a sulfinic acid group.

12. A light-sensitive element as in claim 1, wherein the molecular weight of the polymer is from $1 \times 10^4$ to $1 \times 10^7$.

13. A light-sensitive element as in claim 1, wherein the molecular weight of the polymer is from $1 \times 10^5$ to $2 \times 10^6$.

14. A silver halide photographic light-sensitive element as claimed in claim 1, wherein said gelatin hardening agent is selected from the group consisting of aldehydes, N-methylol compounds, dioxane derivatives, active vinyl compounds, active halogen compounds, mucohalogenic acids, isooxazoles, dialdehyde starch, and 1-chloro-6-hydroxytriazinylated gelatin.

* * * * *